United States Patent [19]

Harris, Jr. et al.

[11] 4,110,661
[45] Aug. 29, 1978

[54] LIGHT EMITTING DEVICE FOR OPTICAL COMMUNICATIONS

[75] Inventors: James S. Harris, Jr.; Richard C. Eden, both of Thousand Oaks; Earl S. Cory, Camarillo; Fred W. Scholl, Thousand Oaks, all of Calif.

[73] Assignee: Rockwell International Corporation, El Segundo, Calif.

[21] Appl. No.: 783,882

[22] Filed: Apr. 1, 1977

[51] Int. Cl.$^2$ .................. H05B 33/16; H05B 33/24
[52] U.S. Cl. .................................. 313/499; 313/111; 313/113; 357/17
[58] Field of Search ............... 313/499, 500, 111, 113; 357/17

[56] References Cited

U.S. PATENT DOCUMENTS

| | | | |
|---|---|---|---|
| 3,667,004 | 5/1972 | Kuhn et al. | 313/499 X |
| 3,676,668 | 7/1972 | Collins et al. | 313/499 X |
| 3,703,670 | 11/1972 | Kunz | 313/499 X |
| 3,877,052 | 4/1975 | Dixon et al. | 313/499 X |
| 3,936,855 | 2/1976 | Goell et al. | 357/17 |
| 3,964,157 | 6/1976 | Kuhn et al. | 357/17 X |
| 3,974,514 | 8/1976 | Kressel et al. | 357/17 |
| 3,996,492 | 12/1976 | McGroddy | 357/17 X |
| 4,010,483 | 3/1977 | Liu | 357/17 |
| 4,058,750 | 11/1977 | Schöberl | 313/500 |

Primary Examiner—Palmer C. Demeo
Attorney, Agent, or Firm—L. Lee Humphries; Craig O. Malin

[57] ABSTRACT

A high-speed, light emitting device which utilizes a solid state source for generating light for use in fiber optical communications. The source is an active, narrow band gap layer of semiconductive material between heterojunctions formed with a p$^+$-type material on one side of an n$^+$-type material on the other side. A mirror on the back of the source reflects light toward an optical fiber abutting the substrate on the front of the source. A side mirror traverses the edge of the active layer at an angle of about 45° and reflects light traveling parallel to the active layer toward the optical fiber. Contacts are coupled to the semiconductor material for applying an electrical signal across the active layer to generate light. In a preferred embodiment, the active layer is GaAsSb joined to GaAlAsSb and the substrate is GaAs.

5 Claims, 4 Drawing Figures

LIGHT EMITTING DEVICE FOR OPTICAL COMMUNICATIONS

BACKGROUND OF THE INVENTION

A. Field of the Invention

The invention relates to the field of optical communications and particularly to solid state sources of light for use in fiber optical communication systems.

B. Description of the Prior Art

Efficient fiber optical communication requires a light source having high speed, high external quantum efficiency, and high source-to-fiber coupling efficiency in a package which is mechanically stable and readily mated to the fiber or fiber bundle. Prior attempts to meet such requirements have not been completely successful. Conventional GaAs light emitting diodes have not achieved high efficiency because of self-absorption of the generated light in the absorbing GaAs substrate. To decrease such self-absorption, the prior art has utilized the "Burrus etched-well" structure in which the absorbing GaAs substrate is simply etched away. While such structure does improve external efficiency, the resulting device is too fragile to be useful in a practical system.

To overcome the problem of low efficiency or fragile GaAs devices, diodes have also been fabricated using amphoterically doped Si diodes. While these Si diodes are efficient, they are notoriously slow (bandwidths less than 1 MHz). Unfortunately, the physical process (shallow, donor-deep acceptor pair recombination) resulting in the high efficiency device necessarily is accompanied by a relatively long radiative lifetime. Thus, amphoteric Si doped devices are unsuitable for most optical fiber communication systems.

SUMMARY OF THE INVENTION

It is an object of the invention to provide an improved light emitting device for use in fiber optical communications.

It is an object of the invention to provide a high speed, high external quantum efficiency light emitting device for use in optical communications.

It is an object of the invention to provide a high speed, efficient light emitting device which is readily mated to an optical fiber, has high light-to-fiber coupling efficiency and is mechanically stable.

According to the invention, the device utilizes a solid state source for generating light for use in fiber optical communications. The source is an active, narrow band gap layer of semiconductive material between heterojunctions formed with a p$^+$-type material on one side and an n$^+$-type material on the other side. A mirror on the back of the source reflects light toward an optical fiber abutting the substrate on the front of the source. A side mirror traverses the edge of the active layer at an angle of about 45° and reflects light traveling parallel to the active layer toward the optical fiber. Contacts are coupled to the semiconductor material for applying an electrical signal across the active layer to generate light. In a preferred embodiment, the active layer is GaAsSb joined to GaAlAsSb and the substrate is GaAs.

These and other objects and features of the present invention will be apparent from the following detailed description, taken with reference to the accompanying drawings.

DESCRIPTION OF THE PREFERRED EMBODIMENT

The fiber-to-light emitting diode interface is known to be a significant source of loss in actual and proposed fiber communications systems. This loss results from the mismatch between the Lambertian radiation pattern of conventional planar light emitting diodes and the relatively small numerical aperture of wide band fibers. However, the introduction of small lenses in not generally a solution of this problem. Instead, what is required is a modification of the radiation pattern of the light emitting region itself. Such modification is accomplished by the present invention.

Figure 1:
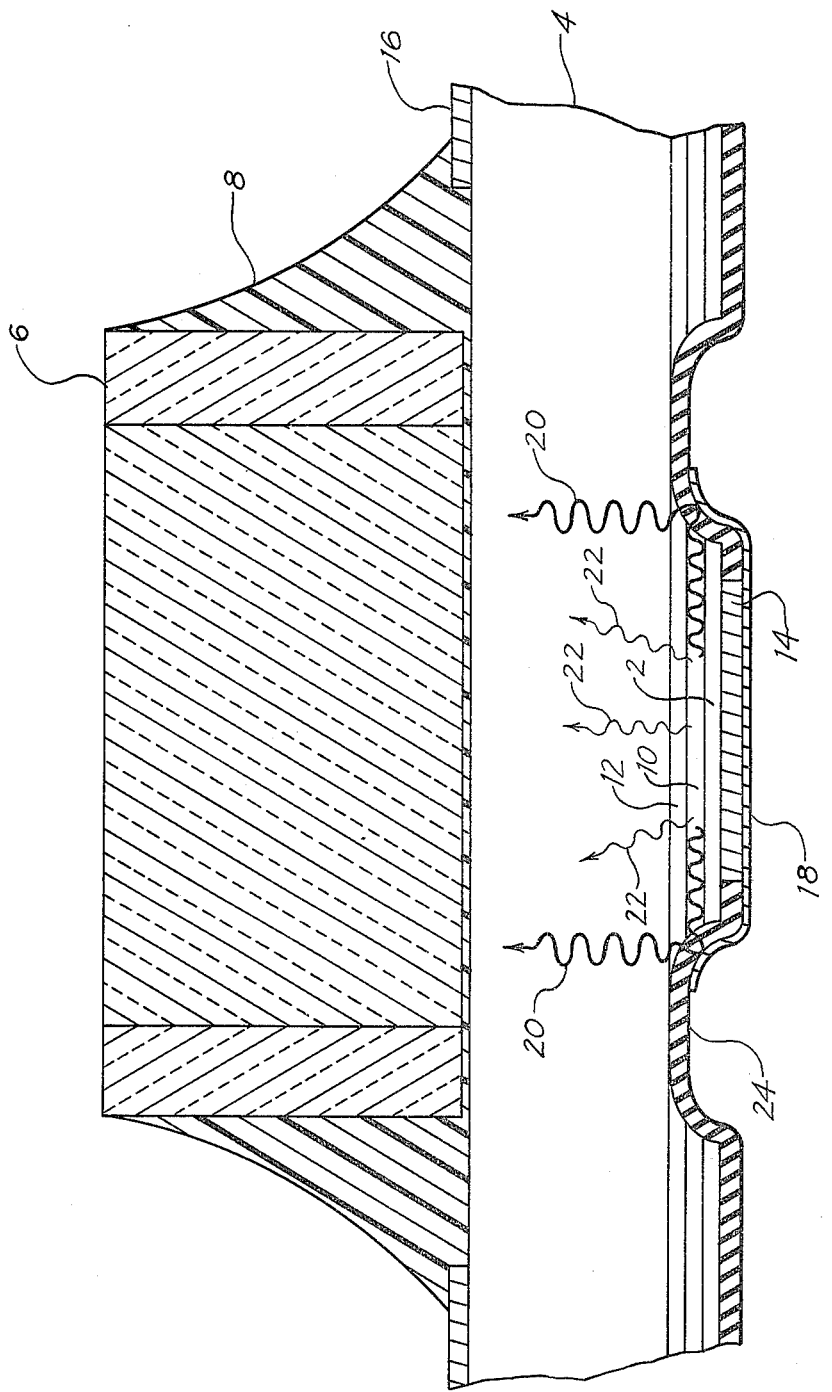
FIG. 1 is a cross section taken through a light emitting device according to the invention.

As shown in the embodiment of FIG. 1, a mesa is formed in a four-layered semiconductor material. The mesa is inverted so that its top layer 2 is the back of the light source, and the generated light is transmitted through the substrate 4 into the multimode optical fiber 6. The optical fiber 6 is bonded to the substrate 4 with an index of refraction matching epoxy 8 which forms a thin film between the end of the fiber 6 and the substrate 4 and a larger fillet between the fiber wall and the substrate. The substrate 4 is an n$^+$-type GaAs alloy.

High efficiency is achieved by using a p-type GaAsSb ternary alloy as the active light emitting layer 10. The active layer 10 is joined by heterojunctions to p$^+$-type and n$^+$-type GaAlAsSb alloy injection layers 2 and 12, respectively. As known in the art, the composition of these alloys can be varied to obtain different band gaps according to the chemical formula $Ga(As_{1-x}Sb_x)$ for active layer 10 and $(Ga_{1-y}Al_y)(As_{1-z}Sb_z)$ for injection layers 2 and 12. However, to avoid self-absorption of light generated in the active layer 10, the surrounding layers 2, 4, 12 must have band gaps larger than the band gap of the active layer 10.

Metal contacts 14 and 16 are deposited on outer layers 2 and 4 respectively so that electrical signals can be applied across the semiconducting layers. In forward bias, electrons and holes are injected into the p-type active layer 10. Recombination in this layer results in spontaneous light emission at a wavelength slightly longer than the n$^+$-type GaAs substrate absorption edge according to the known relation $\lambda = 1.24/\text{bandgap}(\mu)$. In other words, by shifting the internal emission spectrum to longer wavelengths by the introduction of Sb, the self-absorption effects that plague conventional GaAs light emitting diodes is avoided.

In the structure of FIG. 1, the difference in refractive index between the GaAsSb active layer 10 and the GaAlAsSb injection layers 2, 12 on each side will confine all radiation with a half angle of 18° with respect to the plane of the junction. Under high injection conditions, significant optical gain exists in the plane of the junction, as described later. In this situation the optical flux traveling in the plane of the junction is amplified and becomes significantly larger than the flux travelling perpendicular to the plane (i.e., the normal flux observed under low bias current). With an appropriate mesa design this light can be reflected off the mesa wall and into the fiber's narrow acceptance cone. This situation is illustrated schematically in FIG. 1 where the isotropic spontaneous emission is shown as narrow lines 22 and the stimulated emission reflected off the mesa walls portrayed with broad lines 20.

A reflective surface or metal mirror 18 is formed along the sides of the mesa to traverse the active layer 10 by an angle less than 90°. This side mirror reflects light from the active layer toward the glass fiber as shown by light rays 20. For most efficient operation, the angle between the mirror and the active layer should be 45° to reflect the light 90° and into the optical fiber. The side mirror can significantly increase the power coupled into the optical fiber, particularly under superradiant operation.

Mirror 18 is extended across the back of the mesa to provide a back reflecting surface so that light striking it is also reflected toward the optical fiber, as shown by light rays 22. Metal contact 14, to the extent it covers the top layer 2 can also serve as a back reflecting surface. A transparent nitride insulating layer 24 is deposited on the back surface of the semiconductive material to insulate it from the mirror 18.

In the superradiant mode of operation, light 20 trapped in the active guiding layer 10 is coupled into the fiber 6 by mirror 18 formed at 45° to the plane of this layer. At low current densities, this light is absorbed by band-to-band processes and does not reach the fiber. As the current density increases, eventually the net gain reaches zero, and all the light trapped in the plane of the active layer can reach the fiber (limited by fiber numerical aperture). Finally, at the highest current densities, true superradiant operation, in which the guided light is amplified by stimulated emission, will be attained.

An approximate geometrical optics description of device operation gives a quantitative estimate of the performance levels attainable. The direct power coupled into the fiber is $$P_D = 2 \times P_o \pi R^2 W \Delta \Omega,$$

where $P_o$ is the spontaneous emission per unit of active layer volume, $\pi R^2 W$ is the active region volume, and $\Delta \Omega$ is the fiber acceptance cone (steradians). The factor of 2 results from reflection at the semiconductor back mirror interface. The $\Delta \Omega$ for a fiber of $NA = 0.3$ is a cone with full apex angle of 9.5°. This power, $P_D$, is the total power coupled into the fiber in the absence of superradiance.

In the geometric optics approximation, the same considerations can be used to determine the superradiant power. The result is:

$$P_s = 4xP_o x \left( \frac{e^{2gR} - 1}{2gR} \right) \pi R^2 W \Delta \Omega,$$

where $g$ is the net optical gain in the active layer. This expression differs from the equation for direct power by the factor "4" and by the gain factor in brackets. The "4", instead of "2", is due to the fact that in the horizontal plane, each volume element in the active layer feeds energy into the fiber (after mesa reflection) via four equivalent directions. In this case of a square mesa these directions would obviously be the four normal faces.

The gain factor is an average of the more usual exponential gain factor, $e^{gx}$, over the linear dimension ($0 \leq x \leq 2R$) of the mesa (distributed source amplifier).

Figure 2:
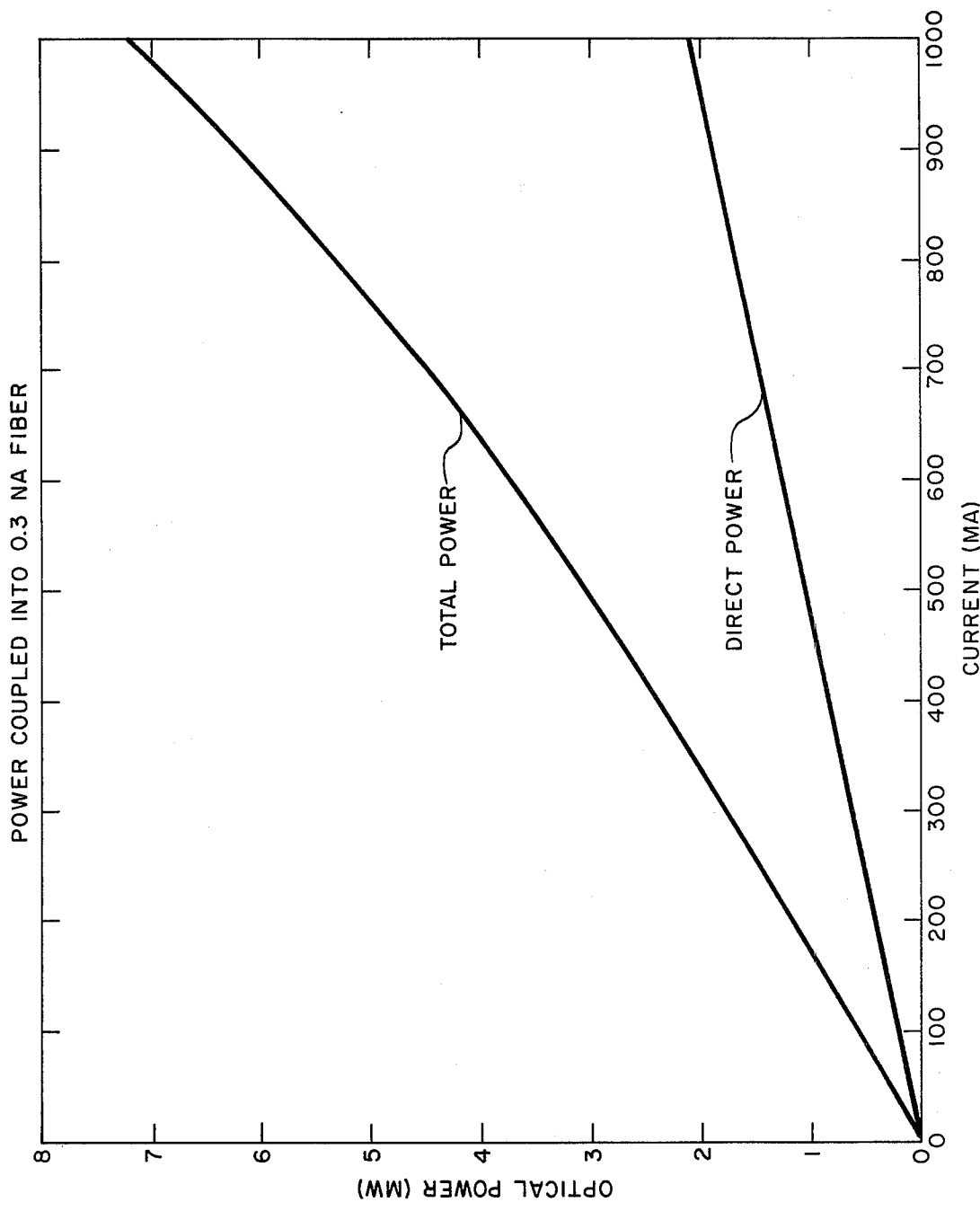
FIG. 2 is a plot showing the effect of superradiant light upon the optical power output of the device.

The total power coupled into the fiber is the sum of the "superradiant power" and the "direct power". For a device having a 10 mil diameter, a 0.75$\mu$m active region thickness, and 0.6 mw/ma internal efficiency, the results in FIG. 2 are obtained. For the superradiant light emitting device, transmitted fiber power (at $NA = 0.3$) should be at least one milliwatt; other device configurations, notably Burrus geometry and edge emitting geometry, typically supply $< 300 \mu w$.

Realization of the superradiant mode of operation requires careful control of known material processes to eliminate interfacial defects and to provide proper doping density in the active layer so that suitable gain-current density profiles can be obtained.

To obtain maximum coupling of the superradiant emission into the fiber requires a 45° angle between the plane of the active layer 10 and the reflecting surface 18 along the mesa wall. Etching and masking techniques can be utilized to obtain a mesa having a wall at a suitable angle.

Figure 3:
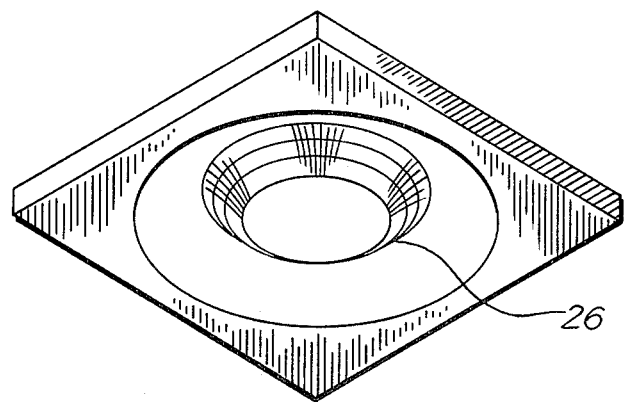
FIG. 3 is a perspective view of a chemically etched mesa of semiconductive layers for use in fabricating the solid state light source of the invention.

In one approach, an etch is used that delineates a useful set of crystallographic planes. For <100> oriented substrates, the <110> planes are ideal and they can be used to define the walls of a square mesa. A known etch for delineating <110> planes is: 3HNO$_3$—1HF—1H$_2$O—1% AgNO$_3$. For <111> substrates, it is difficult to find an appropriate set of planes. For these substrate orientations, an isotropic chemical etch is required. For such etches, the rate of material removal is limited by diffusion of reactants to the liquid-semiconductor interface and thus, preferential etching is not observed. Examples for GaAs include: 8H$_2$SO$_4$—1H$_2$O—1H$_2$O$_2$, and 1HF—1HNO$_3$—1H$_2$O. The shape of the resultant mesa wall 26 is gently curving, as shown in FIG. 3. By careful control of etching time, it is possible to fabricate high efficiency mesa reflectors.

High-speed operation in the device is achieved by the use of a relatively lightly doped p-type active layer 10. The large densities of electrons and holes needed for high peak light output are injected into the p-layer from the surrounding p+ and n+ layers, 2 and 12. The high density of carriers are confined to the GaAsSb active layer 10 by the heterojunction barriers to wider bandgap GaAlAsSb on each side of the active layer. The advantage of the lightly doped active layer is that it results in a device with low depletion region capacitance. This in turn permits higher modulation rates by reduction of RC time constants.

The ultimate modulation rate that can be achieved with any light emitting device depends on several factors: the minority carrier lifetimes, circuit time constants, and, especially, the exact manner in which the device is driven. Conventional operation of the light emitting device results in a bandwidth of less than $\frac{1}{2}\tau$, where $\tau \sim 10$ nsec. Faster modulation can be achieved only if the device turn-off time can be reduced. This, in fact, can be achieved by reversing the driving current and thereby quickly extracting the charge injected into the active layer. The time constant for this process is RC, where R is the series resistance and C is the combination of the depletion region capacitance and the diffusion capacitance. By reducing the depletion region capacitance the turn-off time can be reduced and the usable modulation rate increased. A light output risetime of less than 3 nsec and modulated pulse rates greater than 200 M Bits/sec have been obtained with devices constructed according to the invention.

Figure 4:
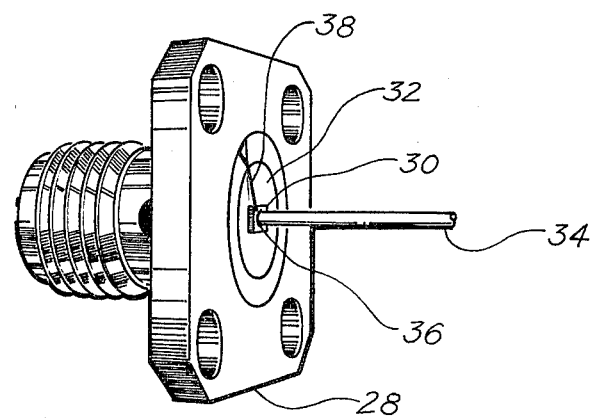
FIG. 4 is a perspective view of the light emitting device according to the invention mounted to the center pin of a miniature coaxial connector.

FIG. 4 shows a light emitting device according to the invention mounted to the center pin of a 3 mm coaxial connector 28. The semiconductive chip 30 containing the mesa is supported in the connector by ceramic insulation 32. A multimode glass fiber 34 is held against the substrate of the chip 30 by a suitable epoxy 36. Electrical connector 38 joins the metal contact on the substrate with the metal flange of coaxial connector 28. The metal contact on the top layer of the mesa (the p-type injection layer previously discussed) is joined to the center conductor of the coaxial connector 28 (not shown in FIG. 4).

While the invention has been described with respect to a GaAlAsSb—GaAs type semiconductor materials combination, other material combinations from the Groups III–V elements which can emit light are also applicable. For example, an InGaAsP—InP materials combination (p doped InGaAsP active layer, p$^+$ and n$^+$ doped InGaAsP injection layers, and an n$^+$ doped InP substrate) can be utilized for practicing the invention. Similarly, while multimode optical fibers, such as a bundle of fiber glass or a coated fiber of glass, have been used to describe the invention, other types of optical wave guides can be utilized.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A light emitting device comprising:
   a mesa formed on a semiconductive substrate of GaAs, said mesa having a top layer of semiconductive GaAlAsSb of one conductivity type, a light emitting active layer of semiconductive GaAsSb of said one conductivity type forming a first heterojunction with said top layer, a third layer of semiconductive GaAlAsSb of opposite conductivity type forming a second heterojunction with said active layer opposite said first heterojunction, and wherein said substrate is of opposite conductivity type and forms a junction with said third layer, the semiconductive GaAsSb of said active layer having a bandgap smaller than the bandgap of the semiconductive material of the other layers and having a refractive index different than the refractive index of the adjacent layers so that some light is confined to travel within said active layer toward the wall of said mesa, said mesa having walls which encircle it and which traverse said active layer at an angle of substantially 45°;
   a transparent insulating layer deposited on at least said walls;
   contacts coupled to said top layer and said substrate for applying an electrical signal across said active layer so that light is emitted from said active layer;
   a top mirror adjacent said top layer for reflecting light toward said substrate;
   a side mirror deposited on said insulating layer, said side mirror intersecting the plane of said active layer at substantially 45° so that light from said active layer striking said side mirror is reflected toward said substrate; and
   an optical fiber having an end coupled to said substrate opposite said active layer, the area of said end being substantially the same or larger than the area of said active layer, whereby the light reflected by said side reflecting mirror is received by said fiber.

2. A light emitting device comprising:
   a mesa formed on a semiconductive substrate, said mesa having a top layer of semiconductive material of one conductivity type, a light emitting active layer of semiconductive material of said one conductivity type forming a first heterojunction with said top layer, a third layer of semiconductive material of opposite conductivity type forming a second heterojunction with said active layer opposite said first heterojunction, and wherein said substrate is of opposite conductivity type and forms a junction with said third layer, the semiconductive material of said active layer having a bandgap smaller than the bandgap of the semiconductive material of the other layers and having a refractive index different than the refractive index of the adjacent layers so that some light is confined to travel within said active layer toward the wall of said mesa, said mesa having walls which encircle it and which traverse said active layer at an angle of substantially 45°;
   a transparent insulating layer deposited on at least said walls;
   contacts coupled to said top layer and said substrate for applying an electrical signal across said active layer so that light is emitted from said active layer;
   a top mirror adjacent said top layer for reflecting light toward said substrate;
   a side mirror deposited on said insulating layer, said side mirror intersecting the plane of said active layer at substantially 45° so that light from said active layer striking said side mirror is reflected toward said substrate; and
   an optical fiber having an end coupled to said substrate opposite said active layer, the area of said end being substantially the same or larger than the area of said active layer, whereby the light reflected by said side reflecting mirror is received by said fiber.

3. The light emitting device as claimed in claim 2, wherein said side mirror and said top mirror are contiguous.

4. The light emitting device as claimed in claim 2, wherein said top layer comprises p$^+$ doped GaAlAsSb, said active layer comprises p doped GaAsSb, said third layer comprises n$^+$ doped GaAlAsSb, and said substrate comprises n$^+$ doped GaAs.

5. The light emitting device as claimed in claim 2, wherein said front layer comprises n$^+$ doped InP, said fourth layer comprises n$^+$ doped In GaAsP, said active layer comprises p-doped InGaAsP, and back top layer comprises p$^+$ doped InGaAsP.

* * * * *